US008411402B2

(12) United States Patent
Halvarsson

(10) Patent No.: US 8,411,402 B2
(45) Date of Patent: Apr. 2, 2013

(54) ARRANGEMENT AND A METHOD FOR COOLING

(75) Inventor: Per Halvarsson, Västerås (SE)

(73) Assignee: ABB Technology Ltd., Zürich (CH)

( * ) Notice: Subject to any disclaimer, the term of this patent is extended or adjusted under 35 U.S.C. 154(b) by 722 days.

(21) Appl. No.: 12/306,002

(22) PCT Filed: Jun. 22, 2006

(86) PCT No.: PCT/SE2006/000770
§ 371 (c)(1),
(2), (4) Date: Sep. 23, 2009

(87) PCT Pub. No.: WO2007/149022
PCT Pub. Date: Dec. 27, 2007

(65) Prior Publication Data

US 2010/0014337 A1 Jan. 21, 2010

(51) Int. Cl.
*H02H 5/00* (2006.01)

(52) U.S. Cl. .......................................................... 361/103

(58) Field of Classification Search ................... 361/103
See application file for complete search history.

(56) References Cited

U.S. PATENT DOCUMENTS 6,215,682 B1 4/2001 Akamatsu
7,538,426 B2 * 5/2009 Yamabuchi et al. .......... 257/714
7,591,302 B1 * 9/2009 Lenehan et al. .............. 165/247

FOREIGN PATENT DOCUMENTS

EP 0766308 A2 4/1997
SE 208193 C 10/1966

OTHER PUBLICATIONS

European Search Report—Feb. 2, 2007.
European Search Report from the European Patent Office, dated Aug. 3, 2011, issued in connection with counterpart European Patent Application No. 06747957.6.

* cited by examiner

*Primary Examiner* — Stephen W Jackson
(74) *Attorney, Agent, or Firm* — Venable LLP; Eric J. Franklin

(57) ABSTRACT

An arrangement for cooling a high voltage converter including a major loop with a pump for making a coolant liquid to pass power semiconductor devices of the converter and a heat exchanger for lowering the temperature of the coolant liquid before passing the power semiconductor devices again. An extra loop is connected to the major loop. The extra loop has a cooling apparatus containing a volume of a cooling medium and adapted to cool the medium to a temperature substantially lower than the temperature of the coolant liquid after having passed the heat exchanger in the major loop. A control unit is adapted to divert at least a part of the coolant liquid to flow through the extra loop when the need of cooling the power semiconductor devices of the converter is extremely high.

29 Claims, 1 Drawing Sheet

ARRANGEMENT AND A METHOD FOR COOLING

CROSS-REFERENCE TO RELATED APPLICATIONS

This application is the national phase under 35 U.S.C. §371 of PCT/SE2006/000770 filed 22 Jun. 2006.

TECHNICAL FIELD OF THE INVENTION AND PRIOR ART

The present invention relates to an arrangement for cooling a high voltage converter comprising means adapted to conduct a coolant liquid in a loop as well as pumping means for making the coolant liquid circulating in said loop, said loop being adapted to conduct said coolant liquid to pass power semiconductor devices of said converter for absorbing heat energy generated thereby and a heat exchanger of the arrangement for lowering the temperature of said coolant liquid before passing said power semiconductor devices again, as well as a method.

Said high voltage converter may be of any type needing cooling of said power semiconductor devices contained therein, such as converters in converter stations of power transmission systems, such as for HVDC (High Voltage Direct Current) and in Static Var Compensators for reactive power control. "High voltage" normally means a voltage exceeding 5 kV, and it is often as high as above 20 kV.

A comparatively high number of said power semiconductor devices, such as thyristors, IGBTs or the like, are mostly connected in series in such converters for being able to together hold the high voltage to be held in the blocking state of the converter.

These power semiconductor devices have to be dimensioned for the most extreme operation conditions of the converter possible, such as the highest possible ambient temperature combined with the highest possible load, i.e. power transmitted through the converters, considering the cooling capacity of said arrangement adapted to cool the converter. Thus, the cooling capacity of such an arrangement determines the dimensioning of the power semiconductor devices, which have to be able to be subjected to these extreme conditions without being destroyed. Thus, if for instance the ambient temperature may in a couple of days during a year reach +40° C., the power semiconductor devices have to be dimensioned considering the cooling capacity of said arrangement. It has then also to be considered that a need of highest possible load or overload may occur exactly during a short period of time during these days of extremely high ambient temperature.

This means that the power semiconductor devices of such a converter will be over-dimensioned for most of the operation time thereof, which is particularly valid for high voltage converters in Static Var Compensators that often are floating or operated at limited output and only during short times are operated at maximum output. This over-dimension, which may be equal to a number of power semiconductor devices of the converter being higher than normally required, is very costly, but it has for cooling arrangement of the type defined in the introduction still to be there for avoiding trips, i.e. interruption of the operation thereof, at said extreme conditions.

SUMMARY OF THE INVENTION

The object of the present invention is to provide an arrangement of the type defined in the introduction which addresses said problem of high costs of equipment being superfluous under normal operation conditions of said high voltage converter.

This object is according to the invention obtained by providing such an arrangement, which also comprises a cooling apparatus arranged outside said loop, containing a volume of a cooling medium and adapted to cool this medium to a temperature being substantially lower than the temperature of said coolant liquid after having passed the heat exchanger in said loop, said cooling medium volume is arranged in an extra loop connected to said loop, called major loop, and the arrangement comprises a control unit adapted to control at least a part of the flow of said coolant liquid to be diverted from said major loop to said extra loop for delivering heat to said medium before arriving to the power semiconductor devices upon determining that there is a need of cooling said power semiconductor devices not possible to fulfil by a temperature of said coolant liquid obtainable by circulating it solely in said major loop.

This means that said over-dimensioning of the power semiconductor devices and equipment associated therewith may be drastically reduced, since they do not have to be dimensioned for these extreme conditions in combination with the cooling capacity of said arrangement by circulating the coolant liquid in said major loop any longer. This means that a lower voltage across the converter and a higher current therethrough may be chosen for a certain power to be transmitted thereby, which means that a lower number of power semiconductor devices will be needed and by that costs may be saved for these power semiconductor devices and equipment, such as control equipment, associated therewith. Another advantage of an arrangement of this type is that it is possible to operate said high voltage converter with overload, i.e. transmit more power therethrough than it is designed for under continuous operation, under short periods of time while using said extra cooling loop when there is a need to transmit more power than normally is the case.

According to an embodiment of the invention said extra loop connects to said major loop in the direction of said flow down-stream said heat exchanger and upstream said power semiconductor devices.

According to another embodiment of the invention said control unit is adapted to control the flow of said coolant liquid to normally substantially entirely pass through said major loop without being diverted to said extra loop and only temporarily during short periods of time under operation conditions of said converter with an extreme need of cooling capacity to pass the cooling medium volume adapted to deliver cooling effect to the coolant liquid under these short time periods and to be charged with cooling capacity by being cooled by said apparatus during long periods of time between such short time periods. By charging said cooling medium volume of said extra loop with cooling capacity during long periods of time and utilize this cooling capacity during only short periods of time the cooling apparatus with said cooling medium volume may be given dimensions making this extra cooling capacity attractive from the cost point of view. Thus, this extra cooling capacity is only utilized when it is really needed for short time overload operation or would high power be transmitted through the converter at a very high ambient temperature during a short period of time, such as in the order of half an hour or slightly more, before the operation of the system to which the converter belongs may be modified to manage said high ambient temperature during continuous operation.

According to another embodiment of the invention the arrangement comprises valves controllable by said control unit for controlling the degree of flow of coolant liquid through said cooling medium volume.

According to another embodiment of the invention the arrangement comprises means adapted to detect the ambient temperature in the surroundings of the converter, and said control unit is adapted to consider information about this temperature when determining whether and how great part of the flow of coolant liquid is to be passed through said cooling medium volume. According to another embodiment of the invention, the arrangement comprises means adapted to measure the power transmitted through said converter, and said control unit is adapted to consider the power value so established when determining whether and how great part of the flow of coolant liquid is to be passed through said cooling medium volume. The value of the ambient temperature and of the power transmitted through the converter are parameters important to consider when deciding whether the cooling capacity of said extra loop shall be temporarily utilized or not. The measurement of the power transmitted may be an indirect measurement, such as by measuring voltage and current.

According to another embodiment of the invention said control unit is adapted to determine that at least a part of said flow of coolant liquid is to be diverted through said volume when said power value exceeds a predetermined level. Thus, the cooling capacity of said extra loop may be always used to a more or less high degree during overload operation of the converter irrespectively of the ambient temperature prevailing.

According to another embodiment of the invention said control unit is adapted to control at least a part of said flow of coolant liquid to be diverted to said extra loop each time over a time period being max 3 hours, advantageously max 2 hours, more preferred max 1 hour, and most preferred max 40 minutes. This makes it possible to keep said cooling apparatus and said cooling medium volume reasonably small and by that realise it to a cost being attractive in this context.

According to another embodiment of the invention said apparatus is adapted to produce an ice slurry when cooling said medium. A comparatively small volume of such an ice slurry may be produced by a cooling apparatus during a long period of time and store a comparatively large cooling capacity by being able to absorb a high amount of heat energy from said coolant liquid, which may have a temperature of about +50° C., before said medium has turned into a liquid having the same temperature as said coolant liquid.

According to another embodiment of the invention said control unit is adapted to conduct said coolant liquid through said ice slurry when said need of cooling exists, which constitutes an efficient way of lowering the temperature of said coolant liquid before arriving to said power semiconductor devices.

According to another embodiment of the invention said pumping means is adapted to pump a coolant liquid in the form of water, which is mostly preferred, especially with respect to availability and the low cost thereof.

According to another embodiment of the invention said cooling apparatus is adapted to cool said cooling medium to a temperature being at least 20° C., advantageously more than 30° C. and preferably 35° C.-50° C. lower than the temperature of the coolant liquid when having passed the heat exchanger. This means that a high cooling capacity may be stored in said cooling medium volume while keeping the dimension thereof restricted.

According to another embodiment of the invention said volume of cooling medium is 100 liters-2000 liters, preferably 200 liters-1000 liters.

According to yet another embodiment of the invention said arrangement is adapted to cool a converter adapted to have a voltage being above 5 kV, above 20 kV, 100 kV-1000 kV. The arrangement may also be adapted to cool a converter adapted to conduct a current therethrough exceeding 50 A or being 100 A-5 kA. According to another embodiment of the invention the arrangement is adapted to cool a converter having a capacity to transmit a power therethrough above 500 MW, preferably above 1 GW, at high load operation thereof. The present invention is the more interesting the higher the power transmitted through high load operation of the converter may be.

The invention also relates to a method for cooling a high voltage converter. The advantages as well as advantageous features of such a method and the embodiments thereof appear from the discussion above of the arrangement according to the invention.

The invention also relates to a Static Var Compensator, a converter station for connecting an AC-system to a HVDC transmission line, a converter station for connecting an AC-system to another AC-system in a back-to-back application, an HVDC (High Voltage Direct Current) transmission system as well as a high voltage AC-system having a converter station with at least one converter having an arrangement for cooling thereof according to the present invention.

The invention also relates to a use of an arrangement according to the invention to cool a converter in a converter station of an HVDC transmission system, a use of an arrangement according to the invention to cool a converter in a back-to-back converter station of a high voltage AC-transmission system and a use of an arrangement according to the invention to cool a converter in a Static Var Compensator.

Further advantages as well as advantageous features will appear from the following description.

BRIEF DESCRIPTION OF THE DRAWING

With reference to the appended drawing, below follows a specific description of an embodiment of the invention cited as an example.

In the drawing.

DETAILED DESCRIPTION OF AN EMBODIMENT OF THE INVENTION

Figure 1:
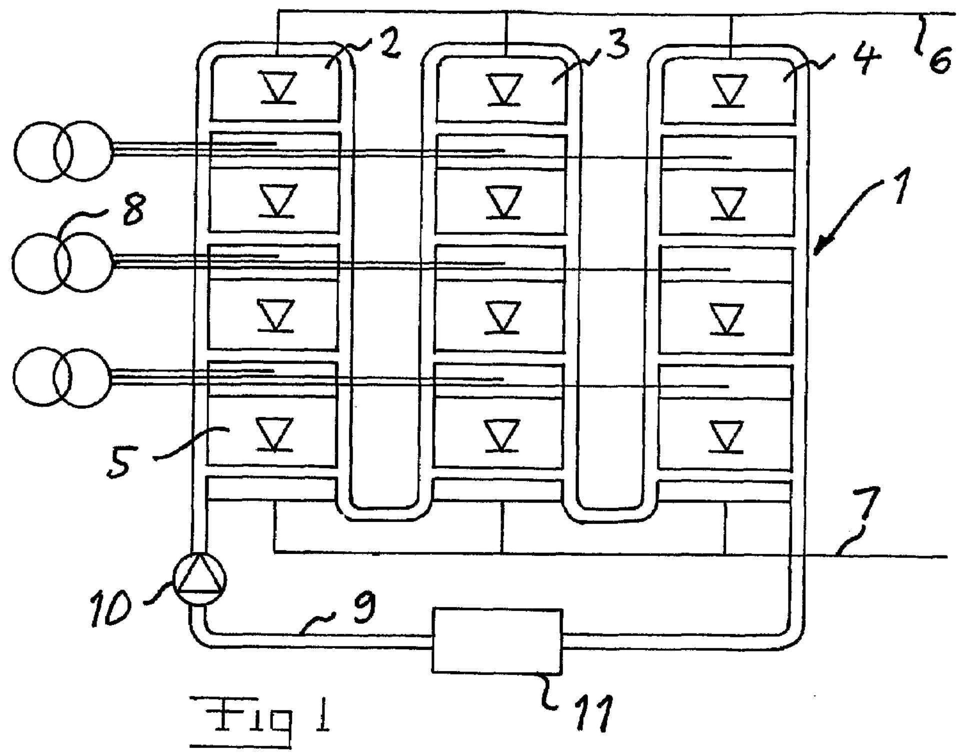
FIG. 1 is a very schematic view illustrating a conventional arrangement for cooling a high voltage converter in a converter station for converting direct voltage into alternating voltage and vice versa.

FIG. 1 illustrates a conventional arrangement for cooling a high voltage converter 1 for converting direct voltage into alternating voltage and vice versa, which may be a part of a converter station in a power transmission system. This converter has three columns 2-4 of four converter valves, such as 5, each connected in series between two poles 6, 7 of a direct voltage side of the converter with transformers 8 connected between said converter valves on the AC-side of the converter. A so-called 12-pulse bridge configuration is formed in this way. Each converter valve 5 has a number of power semiconductor devices, such as thyristors, connected in series for being able to together hold the high voltage to be held thereby in the blocking state of the converter valve. The power semiconductor devices may be line commutated or forced commutated in a way well known to those skilled in the art.

An arrangement is provided for cooling said power semiconductor devices dissipating a lot of heat when conducting current therethrough. This arrangement comprises a loop 9 for conducting a coolant liquid by the means of a pump 10 to pass the power semiconductor devices of the converter valves for cooling thereof. It is pointed out that the Figure is strongly simplified, and that each single power semiconductor device may in the reality be in contact with a cooling block through which said loop passes for cooling thereof. The loop is also provided with a heat exchanger 11 adapted to lower the temperature of the coolant liquid arriving from said power semiconductor devices before it is delivered to the power semiconductor devices again for cooling thereof.

Figure 2:
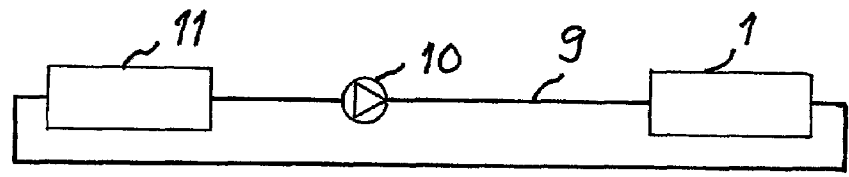
FIG. 2 is a simplified circuit diagram of the arrangement according to FIG. 1.

FIG. 2 is a schematic diagram summarizing the cooling arrangement of FIG. 1, and the converter with the power semiconductor devices is there indicated by the box 1.

Figure 3:
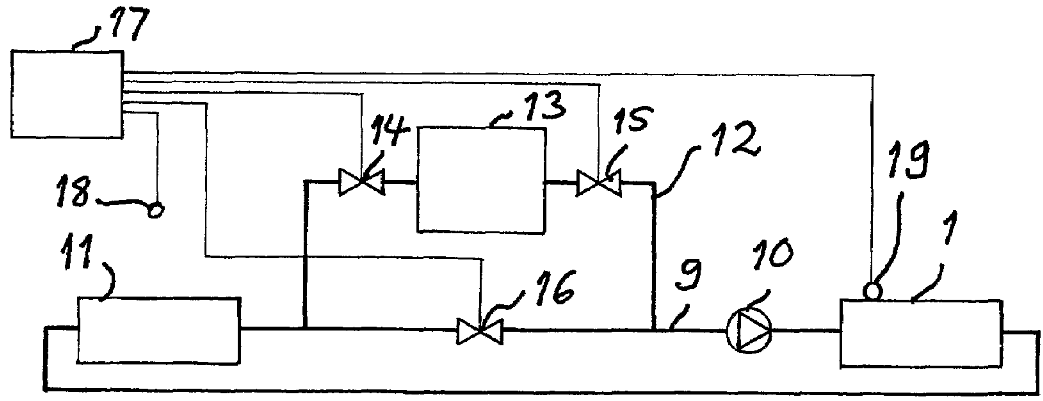
FIG. 3 is a circuit diagram corresponding to FIG. 2 of an arrangement according to an embodiment of the present invention.

FIG. 3 is a schematic diagram of a cooling arrangement according to an embodiment of the invention, which besides said loop 9, hereinafter called major loop, has an extra loop 12 connecting to the major loop in the direction of the flow of the coolant liquid downstream the heat exchanger 11 and upstream the power semiconductor devices, i.e. the converter 1. This extra loop 12 comprises a cooling apparatus 13 containing a volume of a cooling medium and adapted to cool this medium to a temperature being substantially lower than the temperature of the coolant liquid after having passed the heat exchanger 11. The cooling apparatus is in this case adapted to create an ice slurry of a volume being in the order of 500 liters.

The arrangement further comprises valves 14-16 and a control unit 17 adapted to control these valves for controlling the flow of the coolant liquid from said heat exchanger 11 to the converter 1 to go only through the major loop 9 or to be partly or totally diverted through the extra loop 12.

The arrangement also comprises means 18 adapted to measure the ambient temperature in the surroundings of the converter as well as means 19 adapted to measure the power transmitted through the converter and send information thereabout to the control unit 17.

The control unit 17 is adapted to during normal continuous operation of the converter 1 keep the valve 14 closed and direct all the flow of the coolant liquid from the heat exchanger 11 to the converter 1 through the major loop 9, and the cooling apparatus will then cool said cooling medium to form said ice slurry.

When a need arises of providing a cooling capacity which may not be provided by conducting the coolant liquid only through said major loop, such as when there is a desire to temporarily operate the converter at overload, or the ambient temperature in combination with power transmitted through the converter is un-normally high, the control unit is adapted to divert at least a part of the coolant liquid to said extra loop 12 by correspondingly controlling the valves 14-16 for making it to pass said ice slurry and be cooled to a lower temperature then otherwise. Thus, the temperature of the cooling liquid, such as water, arriving to the converter 1 may for example be lowered from +50° C. to +40° C. by being passed through said extra loop 12 during a restricted period of time, such as for example 30 minutes, which means that the converter 1, especially the power semiconductor devices thereof, does not have to be dimensioned for being able to take the extreme conditions prevailing during this restricted period of time. After this time has elapsed and the operation mode of the system to which the converter 1 belongs has been changed the control unit 17 controls the coolant liquid to only pass through the main loop 9 again, and the coolant apparatus 13 will charge the cooling medium thereof with cooling capacity by creating said ice slurry again for being used next time said extreme conditions occur.

The invention is not in any way restricted to the embodiment described above, but many possibilities to modifications thereof will be apparent to a person with skill in the art without departing from the basic idea of the invention as defined in the appended claims.

It is for instance possible to have an arrangement with one said major loop passing more than one converter or having an arrangement according to the invention with a said major loop for only a part of a converter, such as one for each column thereof.

“Volume of cooling medium” is to be interpreted broadly, and the cooling medium does not have to be something that may turned into an ice slurry, but said volume of a cooling medium may be any type of volume that may be charged during longer periods of time to store a high cooling capacity and deliver this cooling capacity during a comparatively short period of time. Thus, it is even possible that said cooling medium volume is a partly or totally solid body cooled to a low temperature during said long periods of time and absorbing heat from said coolant liquid by being passed thereby during said short periods of time.

The invention claimed is:

1. An arrangement for cooling a high voltage converter, comprising:

a major loop adapted to conduct a coolant liquid, a pump configured to circulate the coolant liquid in said loop, said loop being adapted to conduct said coolant liquid to pass power semiconductor devices of said converter for absorbing heat energy generated thereby, a heat exchanger configured to lower a temperature of said coolant liquid before passing said power semiconductor devices again, a cooling apparatus arranged outside said loop, containing a volume of a cooling medium and adapted to cool the volume of medium to a temperature substantially lower than the temperature of said coolant liquid after having passed the heat exchanger in said loop, wherein said cooling medium volume is arranged in an extra loop connected to said major loop, and a control unit adapted to control at least a part of the flow of said coolant liquid to be diverted from said major loop to said extra loop for delivering heat to said medium before arriving to the power semiconductor devices upon determining that there is a need of cooling said power semiconductor devices not possible to fulfil by a temperature of said coolant liquid obtainable by circulating the coolant solely in said major loop.

2. The arrangement according to claim 1, wherein said extra loop connects to said major loop in a direction of said flow downstream said heat exchanger and upstream said power semiconductor devices.

3. The arrangement according to claim 1, wherein said control unit is adapted to control the flow of said coolant liquid to normally substantially entirely pass through said major loop without being diverted to said extra loop and only temporarily during short periods of time under operation conditions of said converter with an extreme need of cooling capacity to pass the cooling medium volume adapted to deliver cooling effect to the coolant liquid under these short time periods and to be charged with cooling capacity by being cooled by said apparatus during long periods of time between such short time periods.

4. The arrangement according to claim 1, further comprising:

valves controllable by said control unit for controlling the degree of flow of coolant liquid through said cooling medium volume.

5. The arrangement according to claim 1, further comprising:

a sensor adapted to measure an ambient temperature in the surroundings of the converter, wherein said control unit is adapted to consider information about the measured ambient temperature when determining whether and how great part of the flow of coolant liquid is to be passed through said cooling medium volume.

6. The arrangement according to claim 1, further comprising:

a sensor adapted to measure power transmitted through said converter, wherein said control unit is adapted to consider the measured power when determining whether and how great part of the flow of coolant liquid is to be passed through said cooling medium volume.

7. The arrangement according to claim 6, wherein said control unit is adapted to determine that at least a part of said flow of coolant liquid is to be diverted through said volume when said power value exceeds a predetermined level.

8. The arrangement according to claim 1, wherein said control unit is adapted to control at least a part of said flow of coolant liquid to be diverted to said extra loop each time over a time period of at most 3 hours.

9. The arrangement according to claim 1, wherein said apparatus is adapted to produce an ice slurry when cooling said medium.

10. The arrangement according to claim 9, wherein said control unit is adapted to conduct said coolant liquid through said ice slurry when said need of cooling exists.

11. The arrangement according to claim 1, wherein said pump is adapted to pump a coolant liquid in the form of water.

12. The arrangement according to claim 1, wherein said cooling apparatus is adapted to cool said cooling medium to a temperature of at least 20° C. lower than the temperature of the coolant liquid when having passed the heat exchanger.

13. The arrangement according to claim 1, wherein said volume of cooling medium is 100 liters-2000 liters.

14. The arrangement according to claim 1, wherein the arrangement is adapted to cool a converter adapted to have a voltage above 5 kV.

15. The according to claim 1, wherein the arrangement is adapted to cool a converter adapted to conduct a current therethrough exceeding 50 A.

16. The arrangement according to claim 1, wherein the arrangement is adapted to cool a converter having a capacity to transmit a power therethrough above 500 MW at high load operation thereof.

17. A method for cooling a high voltage converter, the method comprising:

pumping a coolant liquid in a major loop passing power semiconductor devices of said converter for absorbing heat energy generated thereby and a heat exchanger for lowering a temperature of said coolant liquid before passing said power semiconductor devices again, and diverting at least a part of the flow of said coolant liquid from said major loop to an extra loop containing a volume of a cooling medium cooled to a temperature being substantially lower than the temperature of said coolant liquid after having passed the heat exchanger in said major loop, for delivering heat to said medium before arriving to the power semiconductor devices upon determining that there is a need of cooling said power semiconductor devices not possible to fulfil by a temperature of said coolant liquid obtainable by circulating the said coolant solely in said major loop.

18. The method according to claim 17, wherein diverting the flow from said major loop into said extra loop takes place in a direction of said flow downstream said heat exchanger and upstream said power semiconductor devices.

19. The method according to claim 17, wherein the flow of said coolant liquid is normally controlled to substantially entirely pass through said major loop without being diverted to said extra loop and only temporarily during short periods of time under operation conditions of said converter with an extreme need of cooling capacity to pass the cooling medium volume adapted to deliver cooling effect to the coolant liquid under these short time periods and to be charged with cooling capacity by being cooled during long periods of time between such short time periods.

20. The arrangement according to claim 1, further comprising:

a status var compensator cooled by the arrangement.

21. The arrangement according to claim 1, further comprising:

a converter station for connecting an AC-system to an HVDC transmission line comprising at least one converter cooled by the arrangement.

22. The arrangement according to claim 1, further comprising:

a converter station for connecting an AC-system to another AC-system in a back-to-back application comprising at least one converter cooled by the arrangement.

23. The arrangement according to claim 1, further comprising:

a high voltage direct current transmission system comprising converter stations comprising at least one converter cooled by the arrangement.

24. The arrangement according to claim 1, further comprising:

a high voltage alternating current transmission system comprising a converter station comprising at least one converter cooled by the arrangement in a back-to-back application.

25. The method according to claim 17, wherein the converter is a converter in a converter station of a high voltage direct current transmission system.

26. The method according to claim 17, wherein the converter is a converter in a back-to-back converter station of a high voltage AC transmission system.

27. The method according to claim 17, wherein the converter is a converter in a Static Var Compensator.

28. The method according to claim 17, wherein the flow of said coolant is circulated through said extra loop for at least about half an hour at a time.

29. The arrangement according to claim 1, wherein the control unit is configured to circulate the flow of said coolant through said extra loop for at least about half an hour at a time.

* * * * *